(12) United States Patent
Tan

(10) Patent No.: US 10,209,276 B2
(45) Date of Patent: Feb. 19, 2019

(54) JITTER AND EYE CONTOUR AT BER MEASUREMENTS AFTER DFE

(71) Applicant: TEKTRONIX, INC., Beaverton, OR (US)

(72) Inventor: Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/282,593

(22) Filed: Sep. 30, 2016

(65) Prior Publication Data

US 2018/0045761 A1    Feb. 15, 2018

Related U.S. Application Data

(60) Provisional application No. 62/375,218, filed on Aug. 15, 2016.

(51) Int. Cl.
| | | |
|---|---|---|
| *G01R 13/02* | (2006.01) | |
| *H04L 25/03* | (2006.01) | |
| *H04L 12/26* | (2006.01) | |
| *H04B 3/462* | (2015.01) | |

(52) U.S. Cl.
CPC ........... *G01R 13/029* (2013.01); *H04B 3/462* (2013.01); *H04L 25/03057* (2013.01); *H04L 43/045* (2013.01); *H04L 43/087* (2013.01)

(58) Field of Classification Search
CPC ..... G01R 13/029; H04L 43/04; H04L 43/045; H04L 43/087; H04L 25/03057
See application file for complete search history.

(56) References Cited

U.S. PATENT DOCUMENTS

| 8,374,231 B2 | 2/2013 | Tan |
| 9,191,245 B2 | 11/2015 | Tan |
| 9,397,868 B1 * | 7/2016 | Hossain ............ H04L 25/03057 |
| 2013/0243107 A1 | 9/2013 | Chmelar et al. |

OTHER PUBLICATIONS

Healey et al., "Introduction to DFEEYE," Sep. 27, 2007, 15 pages.
"Serial ATA Revision 3.0," Jun. 2, 2009, 96 pages.
(Continued)

*Primary Examiner* — Toan Le
(74) *Attorney, Agent, or Firm* — Miller Nash Graham & Dunn; Andrew J. Harrington

(57) ABSTRACT

A method of employing a Decision Feedback Equalizer (DFE) in a test and measurement system. The method includes obtaining an input signal data associated with an input signal suffering from inter-symbol interference (ISI). A bit sequence encoded in the input signal data is determined to support assigning portions of the input signal data into sets based on the corresponding bit sequences. The DFE is applied to each set by employing a DFE slicer pattern corresponding to each set, which results in obtaining a DFE adjusted waveform histogram/PDF/waveform database graph for each set adjusted for ISI and accurately captures jitter suppression. The DFE adjusted waveform histogram/PDF/waveform database graphs are normalized and combined into a final histogram/PDF/waveform database graph for determining an eye contour of an eye diagram and jitter measurements.

8 Claims, 16 Drawing Sheets

(56) References Cited

OTHER PUBLICATIONS

"PCI Express Base Specification Revision 3.0," Nov. 10, 2010, 37 pages.
USB 3.1 Engineering Change Notice, USB 3.1 CTLE, applied to USB 3.1 Specification, Revision 1.0, Jul. 31, 2013, 16 pages.
"USB-Type-C Thunderbolt Alternate Mode Electrical Host \ Device Compliance Test Specification," Revision 1.5, Version 0.81, Copyright 2016, Intel Corporation, 85 pages.
"IBIS (I/O Buffer Information Specification)," Version 6.1, Ratified Sep. 11, 2015, IBIS Open Forum 2015, 259 pages.
European Patent Office, Extended European Search Report and Written Opinion for European Application 17186254.3, dated Dec. 13, 2017, 8 pages, Munich, Germany.

\* cited by examiner

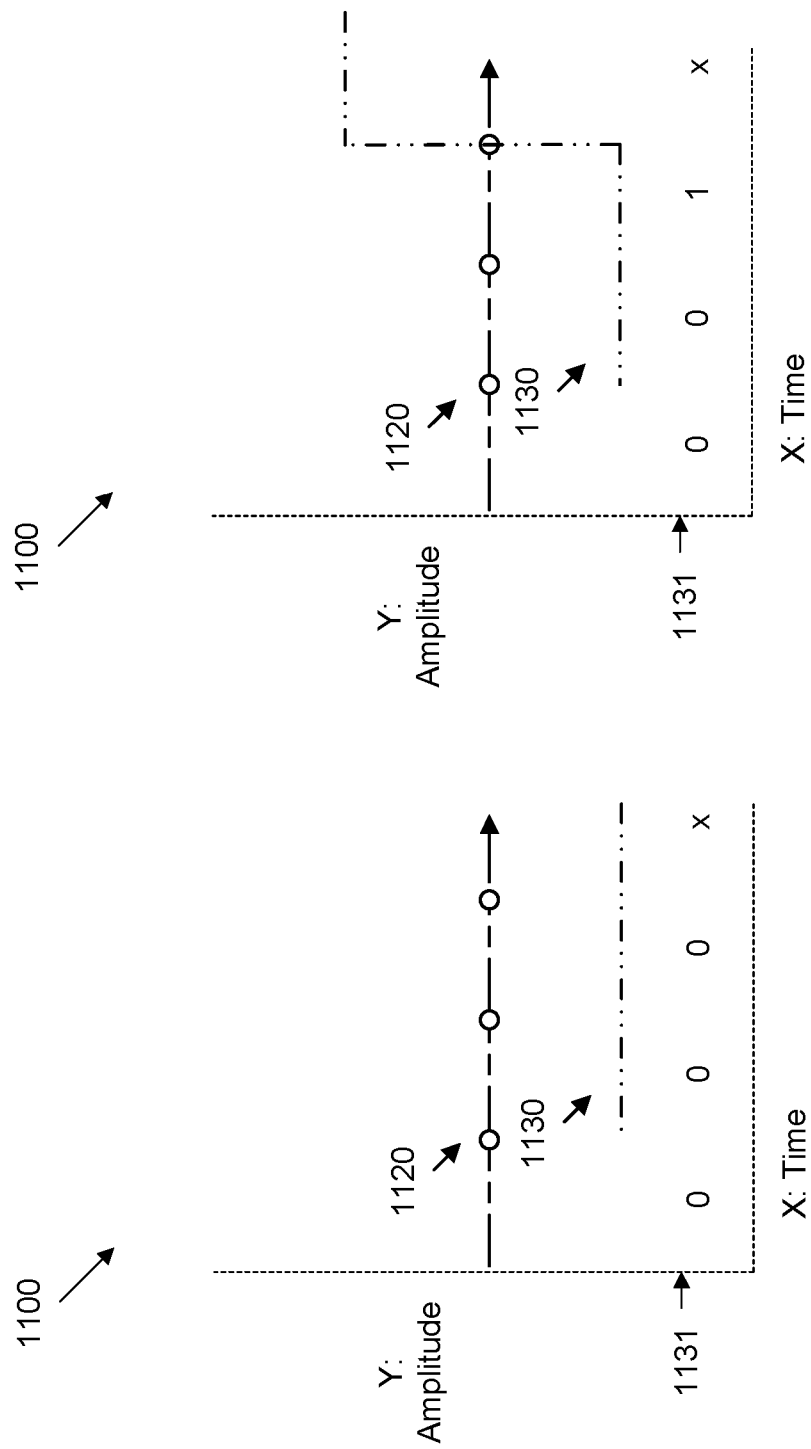

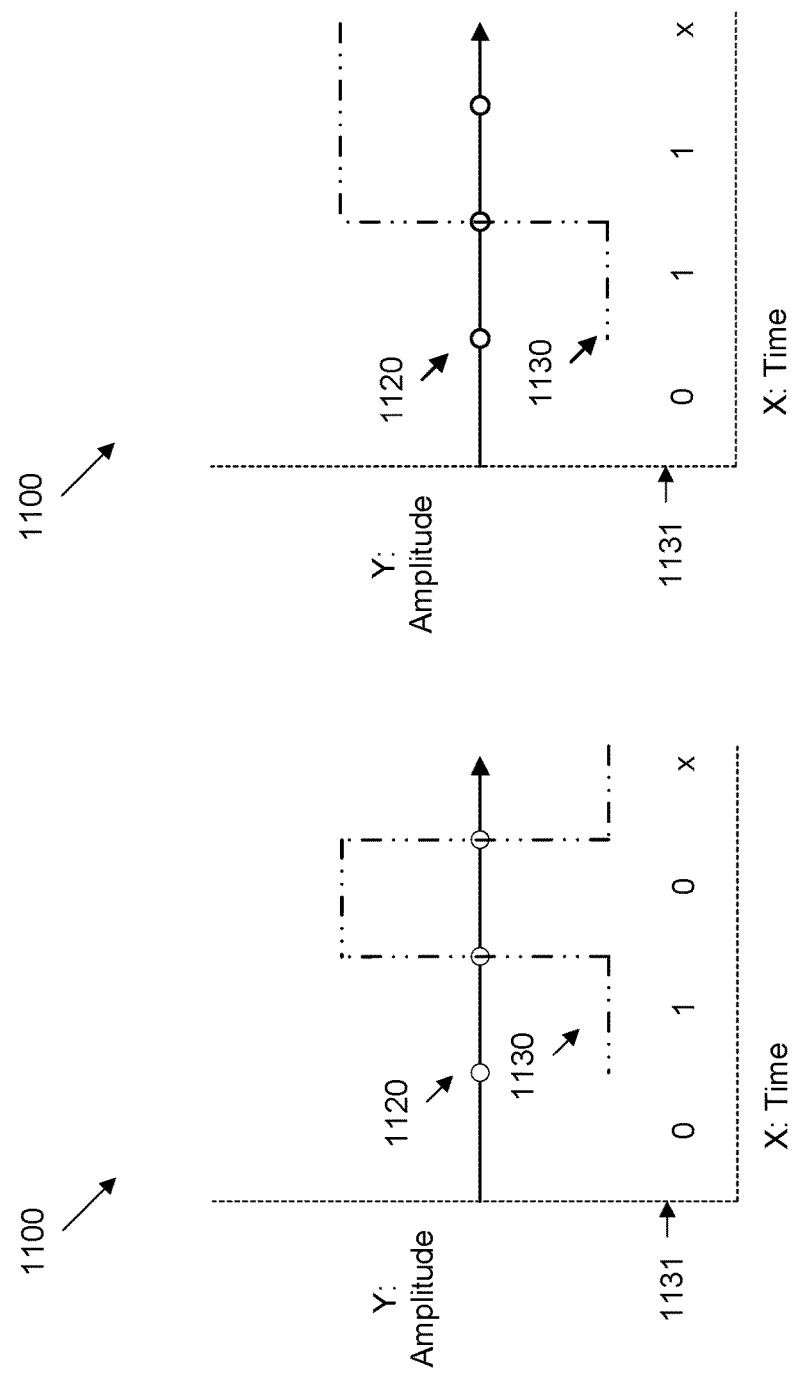

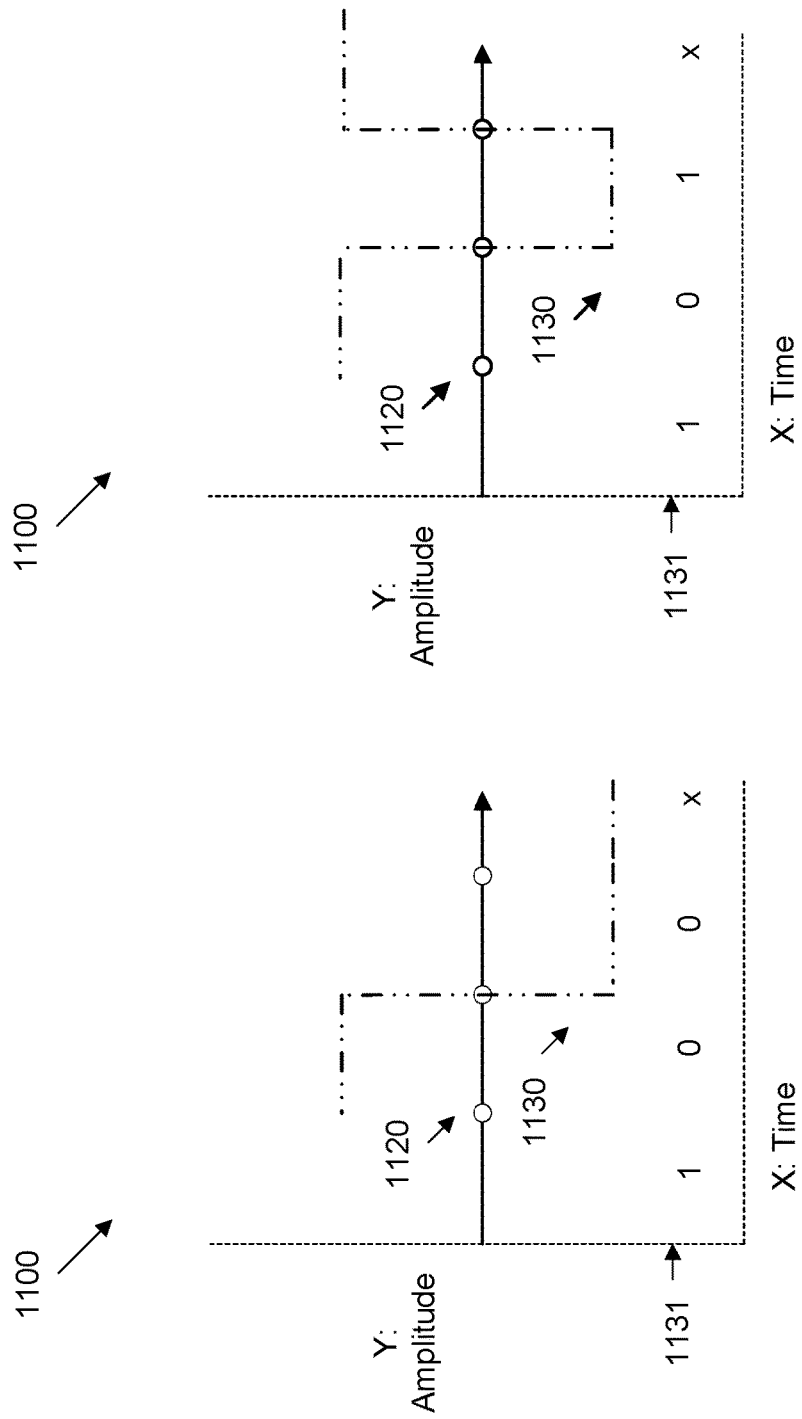

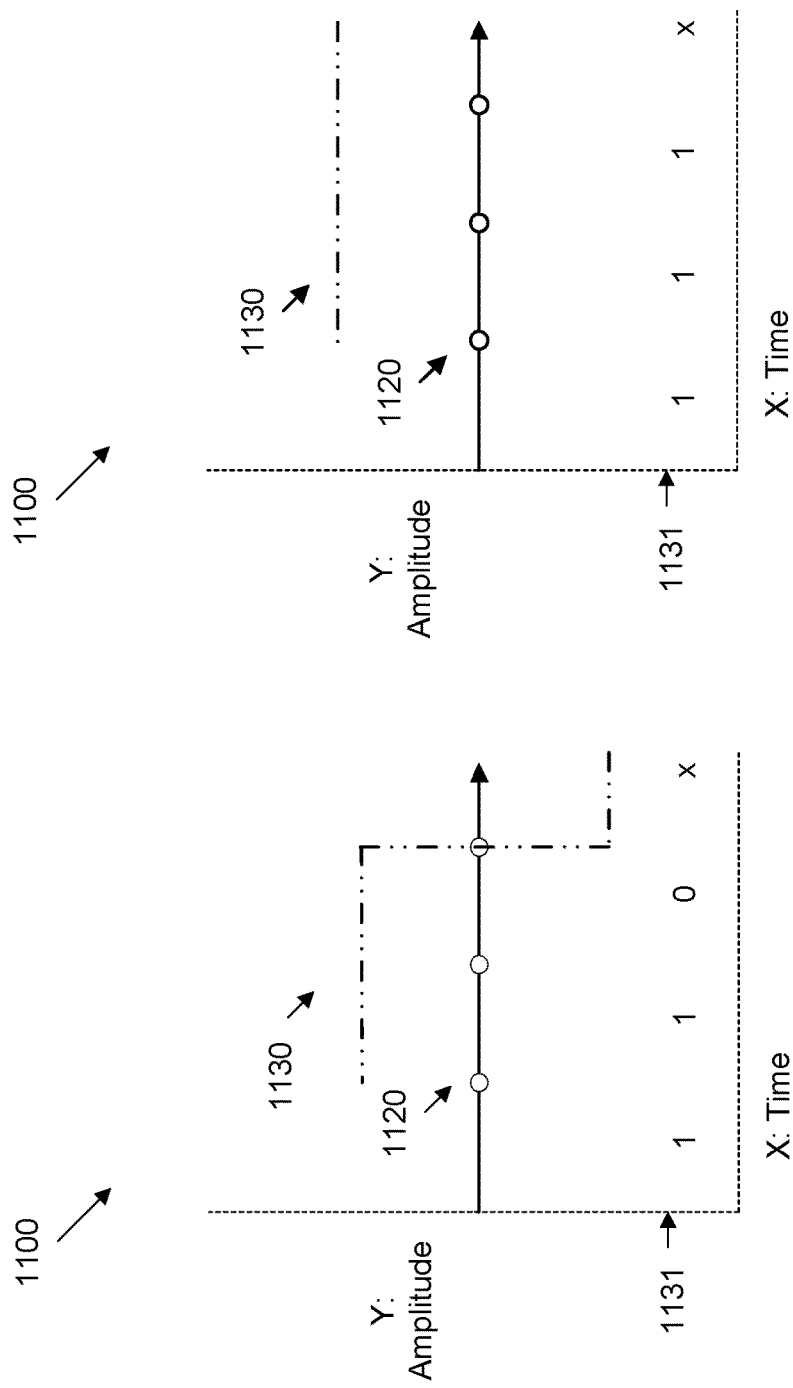

JITTER AND EYE CONTOUR AT BER MEASUREMENTS AFTER DFE

CROSS-REFERENCES TO RELATED APPLICATIONS

The present application claims priority to U.S. Provisional Patent Application Ser. No. 62/375,218, filed Aug. 15, 2016 by Kan Tan, and entitled "Jitter and Eye Contour At BER Measurements After DFE," which is incorporated herein by reference as if reproduced in its entirety.

FIELD OF THE INVENTION

This disclosure is directed to a system and methods for oscilloscope operation, and, more particularly, to a system and methods for employing equalization simulation in an oscilloscope to measure signals suffering from channel based signal impairments.

BACKGROUND

Test and measurement systems are designed to receive signals, sample the signals, and display the results. For example, a high speed signal may be communicated between a transmitter and a receiver via a channel. The transmitter and receiver may employ equalization techniques to overcome impairments caused by the channel. A measurement system may sample and display the signal traversing the channel for testing purposes. To maintain accuracy, the measurement system may simulate equalization techniques to mirror the equalization techniques in the transmitter and receiver. Some equalization techniques in measurement systems properly mirror transmitter and receiver equalization in most respects, but improperly determine signal jitter. By using incorrect jitter values, an eye diagram output by the measurement system is incorrect. The error in the eye diagram can misrepresent the signal at the receiver.

Aspects of the invention address these and other issues.

SUMMARY OF THE DISCLOSURE

Aspects of the disclosed subject matter include a test and measurement system, such as an oscilloscope, configured to employ a Decision Feedback Equalizer (DFE) when performing jitter and Bit Error Rate (BER) measurements. DFE corrects for inter-symbol interference (ISI), but suppresses jitter to varying degrees on certain edge transitions. DFE employs a DFE slicer that acts as a threshold for signal analysis. The speed at which the slicer changes state effects the extent to which the jitter is suppressed during an edge transition. To accurately capture the jitter suppression occurring at the receiver, the measurement system groups the data corresponding to the signal into sets based on bit patterns. The number of sets depends on a number of taps employed for the DFE. A histogram or a probability density function (PDF) is then generated for each set/bit pattern. The DFE is then applied to the histogram/PDF on a per set basis. As the jitter suppression depends on transition, each bit pattern is effected differently by DFE. By applying the DFE on a per set basis based on bit pattern, the effects of the DFE on jitter can be accurately accounted for. Further, the DFE is applied to the set histogram/PDF (e.g. last/after the inclusion of jitter) instead of being applied to the signal on capture and/or before the inclusion of simulated jitter. Accordingly, jitter is correctly included in the histogram/PDF of each set. The histograms/PDFs for each set are then normalized and combined to generate a final histogram/PDF for jitter measurements and for creation of the corresponding eye diagram.

Accordingly, in at least some aspects a test and measurement system comprises an input port structured to receive an input signal via a channel suffering from ISI, and a processor configured to determine bit sequences encoded in the input signal. The processor is further configured to assign portions of the input signal into sets based on the corresponding bit sequences and apply a DFE to each set by employing a DFE slicer pattern corresponding to each set in order to obtain DFE adjusted bit sequences adjusted for ISI. The processor then normalizes and combines the DFE adjusted bit sequences.

In another aspect, a method of employing a DFE in a test and measurement system is disclosed, the method comprises obtaining input signal data associated with an input signal suffering from ISI. Bit sequences encoded in the input signal data are determined. Portions of the input signal data are assigned into sets based on the corresponding bit sequences. The DFE is applied to each set by employing a DFE slicer pattern corresponding to each set in order to obtain a DFE adjusted waveform graph for each set adjusted for ISI. The DFE adjusted waveform database or eye diagrams are normalized. The normalized DFE adjusted eye diagrams are combined into a final eye diagram ($V_{EYE}, T_{EYE}$).

These and other aspects are discussed in more detail herein below.

BRIEF DESCRIPTION OF THE DRAWINGS

FIG. 11a-h are graphs of aspects of DFE slicer patterns to be applied to bit sequence based graph sets to accurately account for the impact of DFE on jitter.

DETAILED DESCRIPTION

Figure 1:
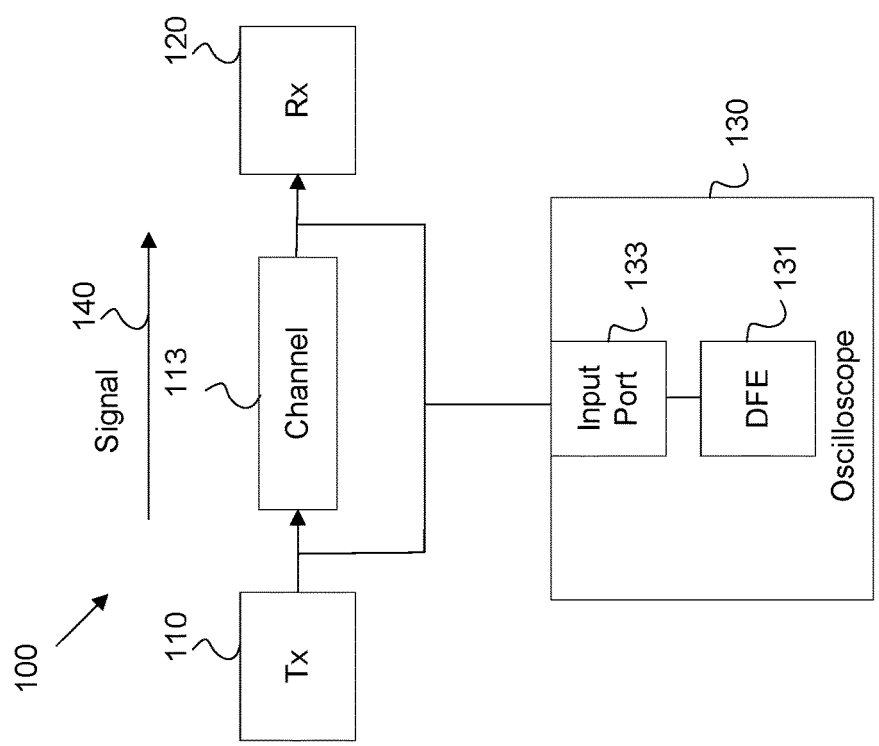
FIG. 1 is a block diagram of an aspect of a test and measurement system including an oscilloscope configured to employ a DFE.

The aspects of the present disclosure are susceptible to various modifications and alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more transitory or non-transitory machine-readable (e.g., computer-readable) storage medium, which may be read and executed by one or more processors. Such instructions may be referred to as a computer program product. A machine-readable storage medium may be embodied as any storage device, mechanism, or other physical structure for storing or transmitting information in a form readable by a machine (e.g., a volatile or non-volatile memory, a media disc, or other media device).

FIG. 1 is a block diagram 100 of an aspect of a test and measurement system including an oscilloscope 130 configured to employ a DFE 131 filter. A transmitter (Tx) 110 transmits a signal 140 to a receiver (Rx) 120 over a channel 113. Oscilloscope 130 is coupled to the Tx 110, Rx 120, and/or channel 113 as needed to capture the signal 140 for testing purposes. A copy of the signal 140 is received via input port 133. DFE 131 is applied to the signal 140 to correspond to DFE applied to signal 140 as acquired or simulated in the Rx 120.

Tx 110 may be any signal source configured to communicate via electrical or optical signals. For example, Tx 110 may be configured to implement a high speed serial standard transmitter, such as PCIE generation 3, PCIE generation 4, USB generation 2, MIPI gear 4, Thunderbolt, etc., which operate at 8 Gigabits per second (Gb/s), 16 Gb/s, 10 Gb/s, 10 Gb/s, and 20 Gb/s, respectively. Signal 140 may be any waveform configured to communicate encoded data, such as sequences of symbols (e.g. bits) over channel 113. For example, signal 140 may be a waveform that encodes data according to an abovementioned high speed serial standard. Channel 113 may be any electrically or optically conductive medium, such as a copper trace, coaxial cable, fibers, etc. Rx 120 may be any device configured to receive and decode signals from Tx 110, via channel 113, for further use. For example, Rx 120 may be any receiver configured according to one of the abovementioned standards.

Oscilloscope 130 is any device configured to act as a test and measurement system for Tx 110, Rx 120, and/or channel 113. For example, oscilloscope 130 may be coupled to the Tx 110, Rx 120, the channel 113, and any combination thereof. The oscilloscope 130 may be coupled to the other components via test probes, cables, accessories, and the like. Input port 133 is any port configured to receive a copy of signal 140. The oscilloscope 130 is configured to process and display the copy of signal 140 as the signal 140 exists at the Tx 110, the Rx 120, and/or any point in between. Accordingly, a user may couple the oscilloscope 130 as needed to test the other components for purposes of debugging, design modification, component configuration, etc.

As discussed in greater detail below, Tx 110, Rx 120, and/or channel 113 have inherent impulse responses. In other words, electrical signals do not change states infinitely quickly. As such, signals encoded according to high speed serial communication standards (e.g. greater than 6 Gb/s) suffer from ISI because symbols are encoded more quickly than the electrical medium's ability to change state allows. ISI results when remaining voltage from a first symbol effects the voltage amplitudes of subsequent symbols. ISI is also caused by reflection and cross couplings. DFE 131 counteracts ISI by considering not just the voltage amplitude of a specified symbol, but also the remaining electrical effects from preceding symbol(s). DFE 131 can be implemented as a hardware or a software filter. DFE 131 employs a DFE slicer that acts as a threshold for determining whether a symbol is a high symbol or a low symbol. DFE 131 can move the slicer up or down for each bit based on preceding bits to account for ISI. Alternatively, DFE 131 can computationally increases/decreases signal amplitude based on preceding bits to compensate for ISI.

Signal 140 also suffers from additional impairments beyond ISI. For example, signal 140 may also suffer from periodic jitter (PJ), random jitter (RJ), periodic noise (PN), random noise (RN), etc. Those impairments are called un-correlated jitter/noise as they are not related to data pattern/bit sequence. As ISI is correlated to data pattern, uncorrelated jitter may be treated separately from ISI. Straightforward application of DFE 131 to each bit in sequence can result in partial or complete suppression of jitter in some cases as discussed below, particularly during bit transitions where jitter is measured. Such jitter suppression, if not correctly accounted for, may result in histograms and EYE diagrams that inaccurately represent signal 140 on the oscilloscope 130 display.

Accordingly, oscilloscope 130 is configured to capture and store signal 140 in memory. The oscilloscope 130 recovers a clock signal corresponding to signal 140, for example by employing a clock recovery circuit. Oscilloscope 130 then determines the bit sequences in the signal 140. Once the bit sequences are determined, the oscilloscope 130 may sort portions of signal 140 into sets based on the bit sequences encoded in the corresponding portions. A histogram/PDF that contains uncorrelated jitter and noise can be created for each bit sequence. DFE 131 is then applied to the histogram/PDF of each set based on the bit sequence contained in the set. DFE 131 employs a slicer movement pattern tailored to the bit sequence of the set, for example the slicer movement patterns shown in FIGS. 11a-h. The per set histograms/PDFs are then normalized and combined into a final histogram/PDF, which is employed to generate an accurate EYE diagram of the signal 140. By employing slicer movement patterns specific to the bit sequence, the slicer patterns can be selected to support proper functionality by accurately capturing jitter suppression occurring at the Rx 120.

Figure 2:
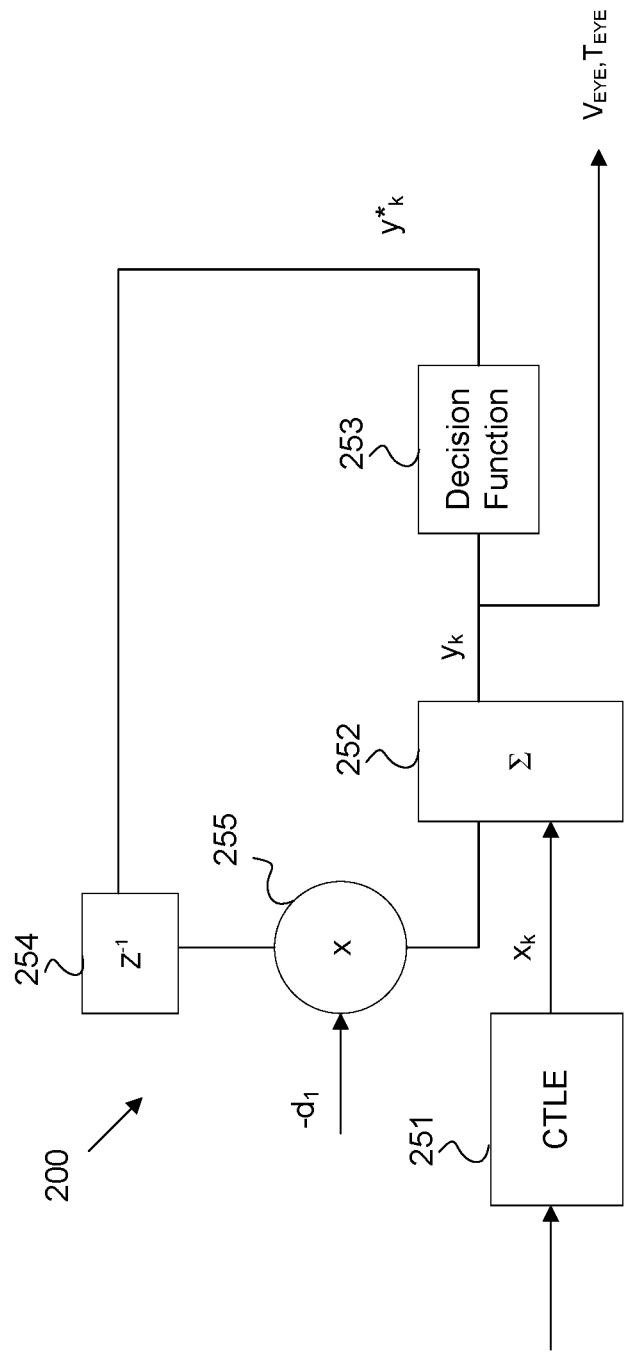
FIG. 2 is a block diagram of an aspect of receiver equalizer that includes a CTLE and a DFE.

FIG. 2 is a block diagram of an aspect of receiver equalizer that includes a CTLE 251 and a DFE 200, which may be employed to implement DFE 131. DFE 200 may be positioned after a Continuous Time Linear Equalizer (CTLE) 251 in the receiver such that the CTLE 251 receives a signal, such as a signal 141. A CTLE 251 filter is a filter configured to compensate for insertion loss over a channel, such as channel 113. CTLE 251 may apply frequency specific gain and/or attenuation to a signal. For example, CTLE 251 may apply gain to high frequencies relative to low frequencies to account for channel specific attenuation and filter out specific high frequencies for purposes of noise control. CTLE 251 may be configured as a second order CTLE.

The signal, as conditioned by the CTLE 251, denoted as $x_k$ where k is a sample index, which is treated as a DFE 200 differential input voltage signal. Signal $x_k$ is forwarded to a summer (Σ) block 252. Σ block 252 is any component configured to perform an additive/subtractive/comparative operation on a plurality of inputs and output the result. For example, Σ block 252 may treat $x_k$ and a feedback threshold signal as a differential signal, compare the input signal and the threshold, and output the result, denoted as $y_k$. $y_k$ is output from the DFE 200 to be employed as a data point of voltage ($V_{EYE}$) and time ($T_{EYE}$) for an EYE diagram. $y_k$ is also forwarded to a decision function 253, which determines whether to maintain a current threshold or change the threshold for the next clock cycle. The output voltage of decision function 253 is denoted as $y^*_k$. The output of decision function 253 is forwarded to time delay ($Z^{-1}$) block 254. $Z^{-1}$ block 254 delays the output of decision function 253 by one clock cycle and forwards the result to feedback coefficient (x) block 255. x block 255 applies any needed coefficient for a previous index ($-d_1$) to the delayed threshold value and feeds the result back into Σ block 252. In other words, the input signal for a current clock cycle is compared to a threshold set at a preceding clock cycle and output. A threshold for a succeeding clock cycle is set based on the output of the current clock cycle, delayed, and fed back into the circuit to influence the succeeding clock cycle computation based on the current output. A feedback between the decision function 253 and the Σ block 252 is referred to as a DFE tap. It should be noted that each additional tap allows the DFE 200 output to effect an additional clock cycle. Accordingly, DFE 200 can employ a comparison threshold determined for a current clock cycle to effect one or more succeeding cycles. As such, a voltage for a current input signal can be compared to a threshold to determine a current symbol, and the threshold is adjusted based on one or more preceding symbols. While DFE 200 is discussed in terms of a hardware operation analyzing an incoming signal, it should be noted that DFE 200 can also be implemented in software to operate on/iterate through data representing an analog signal previously sampled and stored. Mathematically, the behavior of DFE 200 with one-tap can be described as follows:

$$y_k = x_k - d_1 sgn(y_{k-1}) \quad \text{Equation 1}$$

$$y^*_k = sgn(y_k), |y^*_k| = 1 \quad \text{Equation 2}$$

where $sgn(y_{k-1})$ indicates the output of a decision function from a previous index, $sgn(y_k)$ indicates the output of a decision function from a present index, and all other variables are as discussed above. Mathematically, the behavior of DFE 200 with two taps can be described as follows:

$$y_k = x_k - d_1 sgn(y_{k-1}) - d_2 sgn(y_{k-2}) \quad \text{Equation 3}$$

$$y^*_k = sgn(y_k), |y^*_k| = 1 \quad \text{Equation 4}$$

where $d_2 sgn(y_{k-2})$ indicates the output of a decision function from two indexes ago multiplied by a coefficient form two indexes ago, and where all other variables are as discussed above. As can be seen, multiple preceding clock cycles can influence the threshold calculation of the present clock cycle by adding additional terms to eq. 1 and/or 3 as needed.

Figure 3:
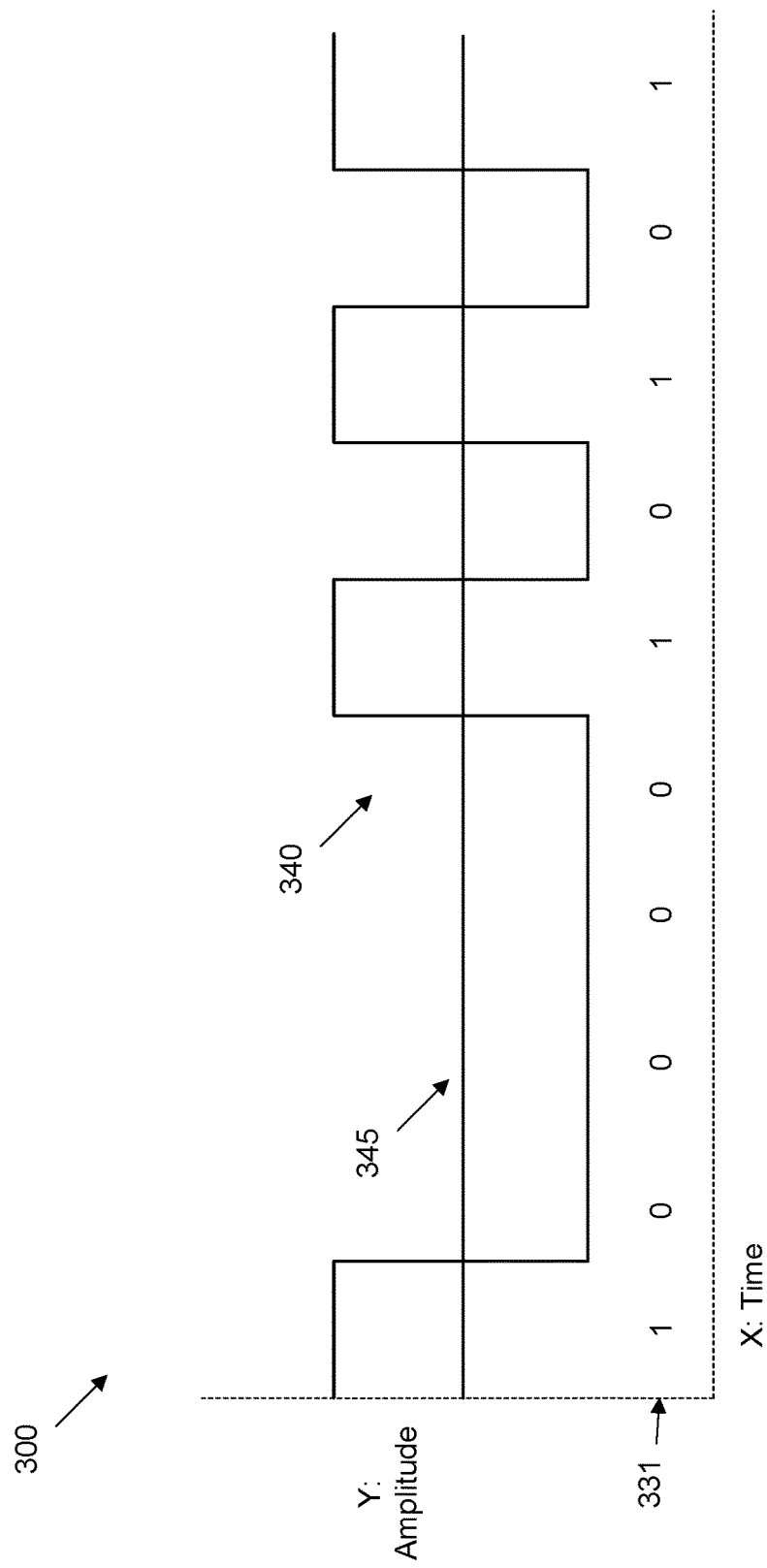
FIG. 3 is a graph of an aspect of an ideal waveform and corresponding bit sequence.

FIG. 3 is a graph 300 of an aspect of an ideal waveform 340 and corresponding bit sequence 331. For example, waveform 340 may be generated by a device coupled to a transmitter, such as Tx 110. Waveform 340 represents bit sequence 331 as high and low values communicated over time. For example, a value of one is represented as a high voltage and a value of zero is represented as a low voltage. The voltage levels for high and low voltages can be set as needed to meet design constraints of the corresponding communication system (e.g. Tx 110, channel 113, and Rx 120). As waveform 340 is an ideal waveform, the high and low voltages transition substantially instantaneously across a threshold 345. Threshold 345 is a value selected to differentiate between high and low voltages. In case of non-deal behavior, any voltage above threshold 345 is treated as a high voltage (e.g. a value of one) and any voltage below threshold 345 is treated as a low voltage (e.g. a value of zero).

Figure 4:
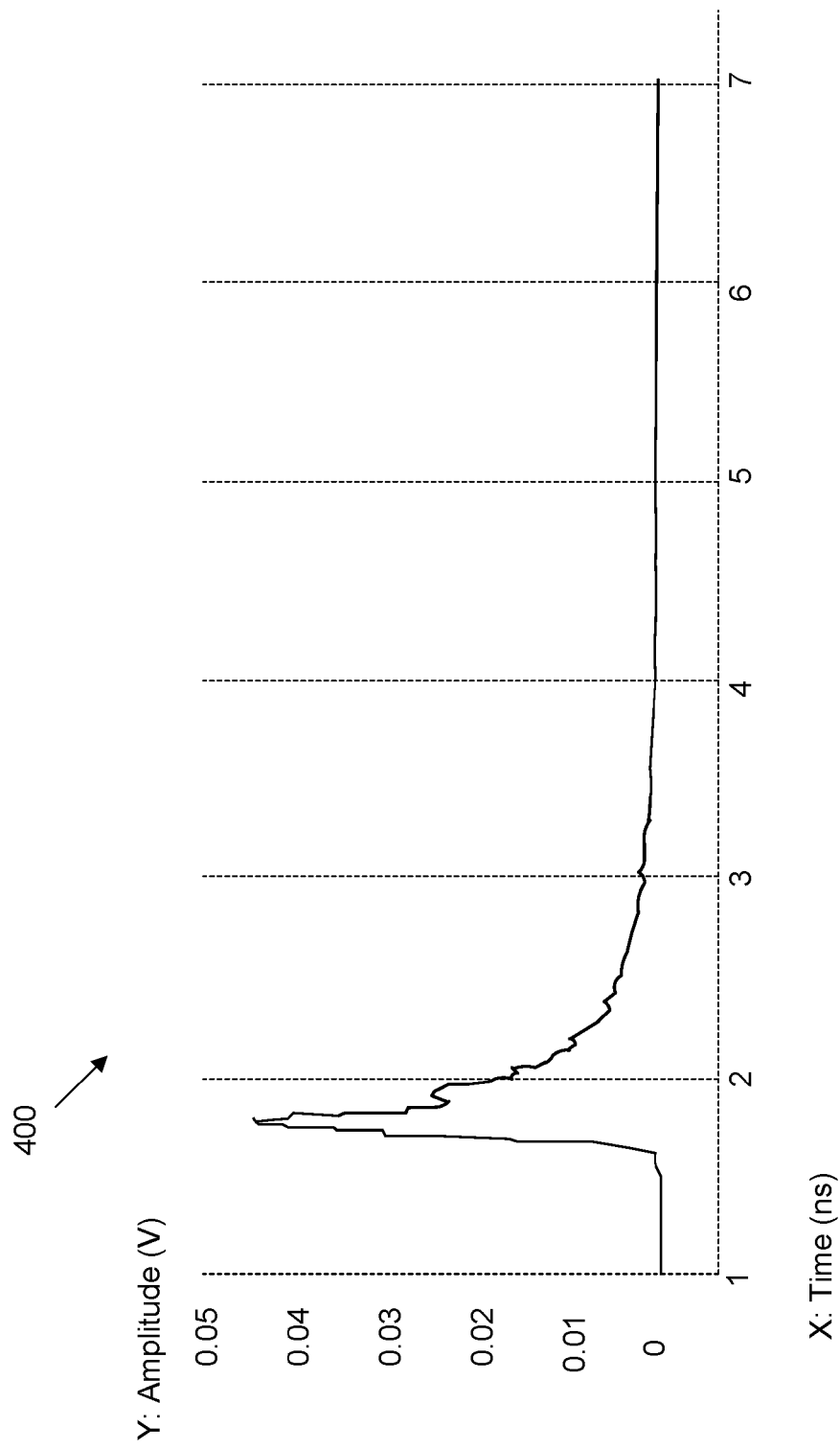
FIG. 4 is a graph of an aspect of an impulse response associated with a lossy channel.

FIG. 4 is a graph 400 of an aspect of an impulse response associated with a lossy channel. Graph 400 depicts an impulse response of an example material, such as material in channel 113. An impulse response is a temporal electrical behavior of the material when subjected to an ideal impulse signal. Graph 400 depicts the impulse response in volts (V) over time in nanoseconds (ns). As shown, state transitions across a real channel are not instantaneous. In the example shown in graph 400, a high signal of about 0.045 V adjusts to about zero in approximately 1.2 ns (e.g. from about 1.8 ns to about 3 ns). Accordingly, in the example of graph 400, signal state changes occurring faster than about 1.2 ns cause temporally adjacent values to interfere with one another in the form of ISI. ISI is any form of signal distortion where one symbol (e.g. a 1 or a 0) interferes with a subsequent symbol. For example, a high voltage at time 1.8 ns followed by a low voltage at 2 ns would result in approximately 0.02 V (e.g. about half) of the remaining high voltage being attributed to the low voltage as ISI.

Figure 5:
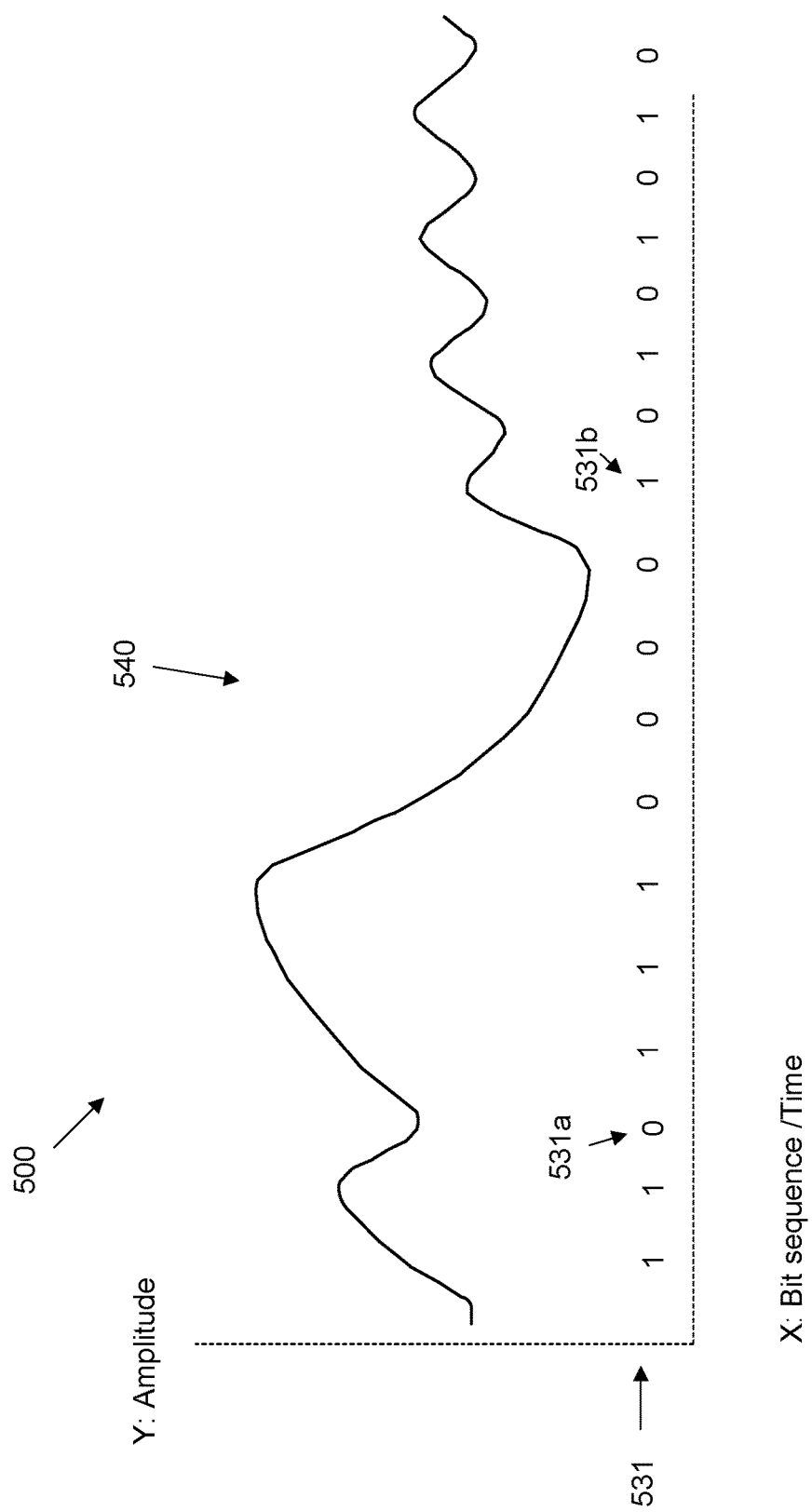
FIG. 5 is a graph of an aspect of a waveform after application of an impulse response from a lossy channel.

FIG. 5 is a graph 500 of an aspect of a waveform 540 after application of an impulse response from a lossy channel, such as channel 113. For example, an ideal waveform, such as ideal waveform 340, communicated quickly enough to suffer from ISI based on the impulse response of the channel may result in a waveform such as waveform 540. A corresponding bit sequence 531 is depicted over time to show the data (e.g. bits/symbols) encoded in the waveform 540 at corresponding points before application of ISI. As can be seen from graph 500, consecutive high amplitude values can push the overall waveform 540 higher, while consecutive low amplitude values can push the overall waveform 540 lower. This can result in difficulties differentiating between high and low values at the receiver. For example, low value 531a follows multiple high values, resulting in a relatively high amplitude low value. Further, high value 531b follows multiple low values, resulting in a relatively low amplitude high value. As a result, the amplitude of low value 531a is largely indistinguishable from the amplitude of high value 531b. As such, for high speed applications suffering from ISI, the receiver should be aware of the context of each symbol. DFE, such as DFE 131, and/or 200 can provide such contextual awareness. DFE can compare each incoming value with preceding value(s) to provide context for signal interpretation. Each DFE tap provides for comparison with an additional preceding value. For example, a two tap DFE would allow a symbol to be compared with two preceding symbols, a three tap DFE would allow a symbol to be compared with three preceding symbols, etc. Accordingly, an increasing the number of DFE taps increases complexity, but overcomes an increasing amount of ISI due to increasingly fast signaling.

Figure 6:
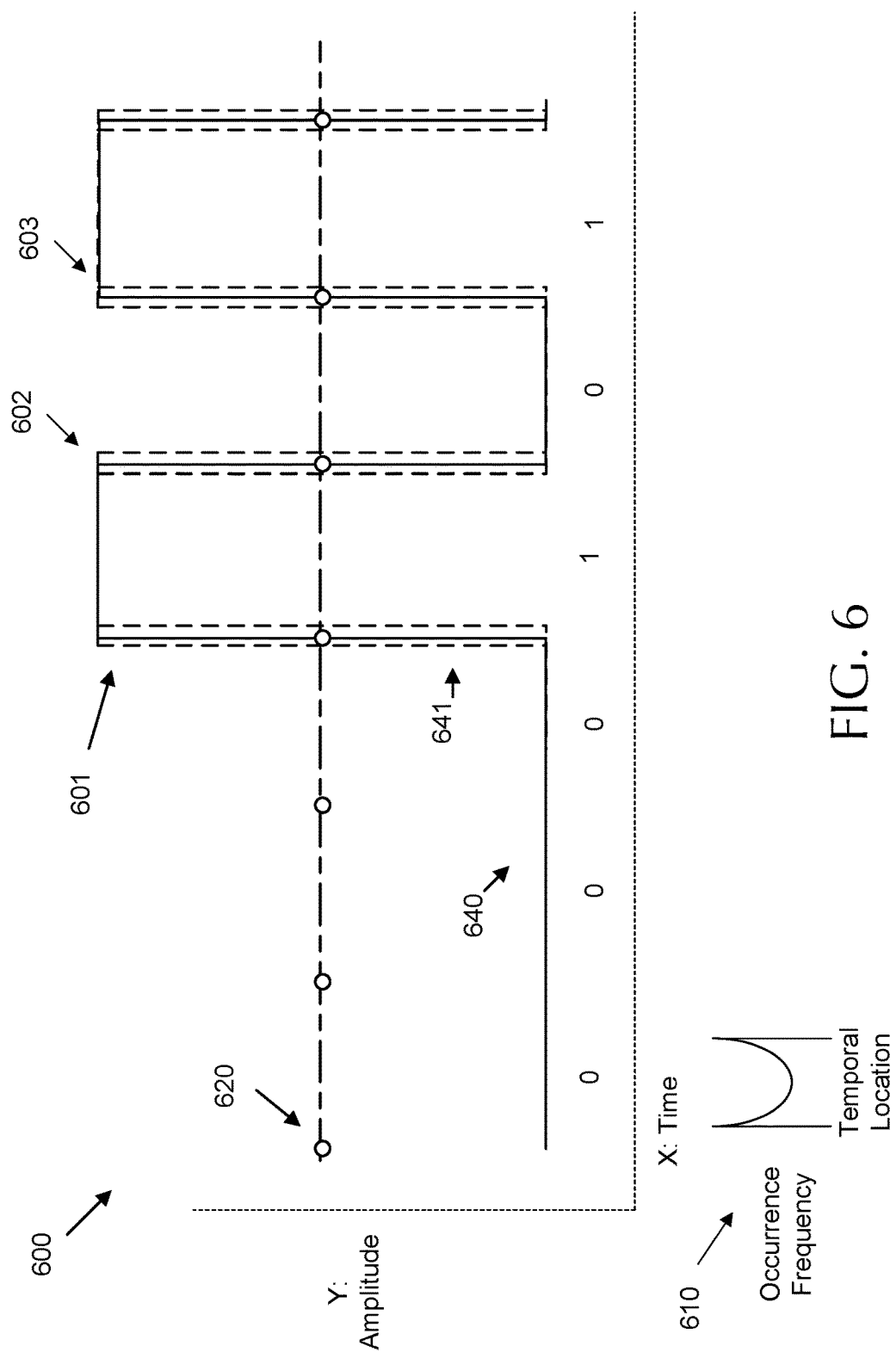
FIG. 6 is a graph of an aspect of ideal waveform after application of jitter.

FIG. 6 is a graph 600 of an aspect of ideal waveform 640, such as ideal waveform 340, after application of jitter 641. Jitter 641 is a temporal variation in signal communication, which can be caused by communication links, such as channel 113. Signal 640 is depicted as a solid line, while signal jitter 641 is depicted in dashed lines. The jitter here is referred to a sinusoidal jitter, a type of periodic jitter (PJ). Such jitter is uncorrelated to bit sequence. Jitter 641 shifts the waveform 640 in time, and hence along the x axis, but not in amplitude, and hence not along the y axis. Clock references 620 are depicted as circles along a transition threshold, which is similar to transition threshold 345. Clock references 620 indicate temporal location where the waveform 640 can change state, sometime referred as a clock cycle, based on a corresponding clock signal. An edge is any portion of a signal that transitions from a first state to a second state. As shown, the waveform 640 changes state at edges 601, 602, and 603. A state transition from a low state to a high state is referred to as a rising edge, while a transition from a high state to a low state is referred to as a falling edge. Edges 601 and 603 are rising edges, while 602 is a falling edge. Edges 601, 602, and 603 should ideally cross the transition threshold during at references 620. However, due to jitter 641, the edges 601, 602, and 603 may occur during any point bounded by the jitter 641 period depicted between the dashed lines.

Histogram 610 is shown to further clarify jitter 641. A histogram 610 is a graphical representation of the distribution of numerical data, and estimates the probability of a continuous variable. Specifically, histogram 610 depicts the number of times waveform 640 edges, such as edges 601, 602, and 603, appear at any specified temporal location relative to the clock references 620 when the same waveform 640 is repeated continuously. Histogram 610 depicts the edge occurrence frequency along the Y axis and the temporal location, relative to the clock references 620, along the x axis. As shown, jitter 641 causes the waveform 640 edges to occur at either edge of the boundary of the jitter 641 period most frequently, with decreasing likelihood of occurring exactly on a clock reference 620.

Figure 7:
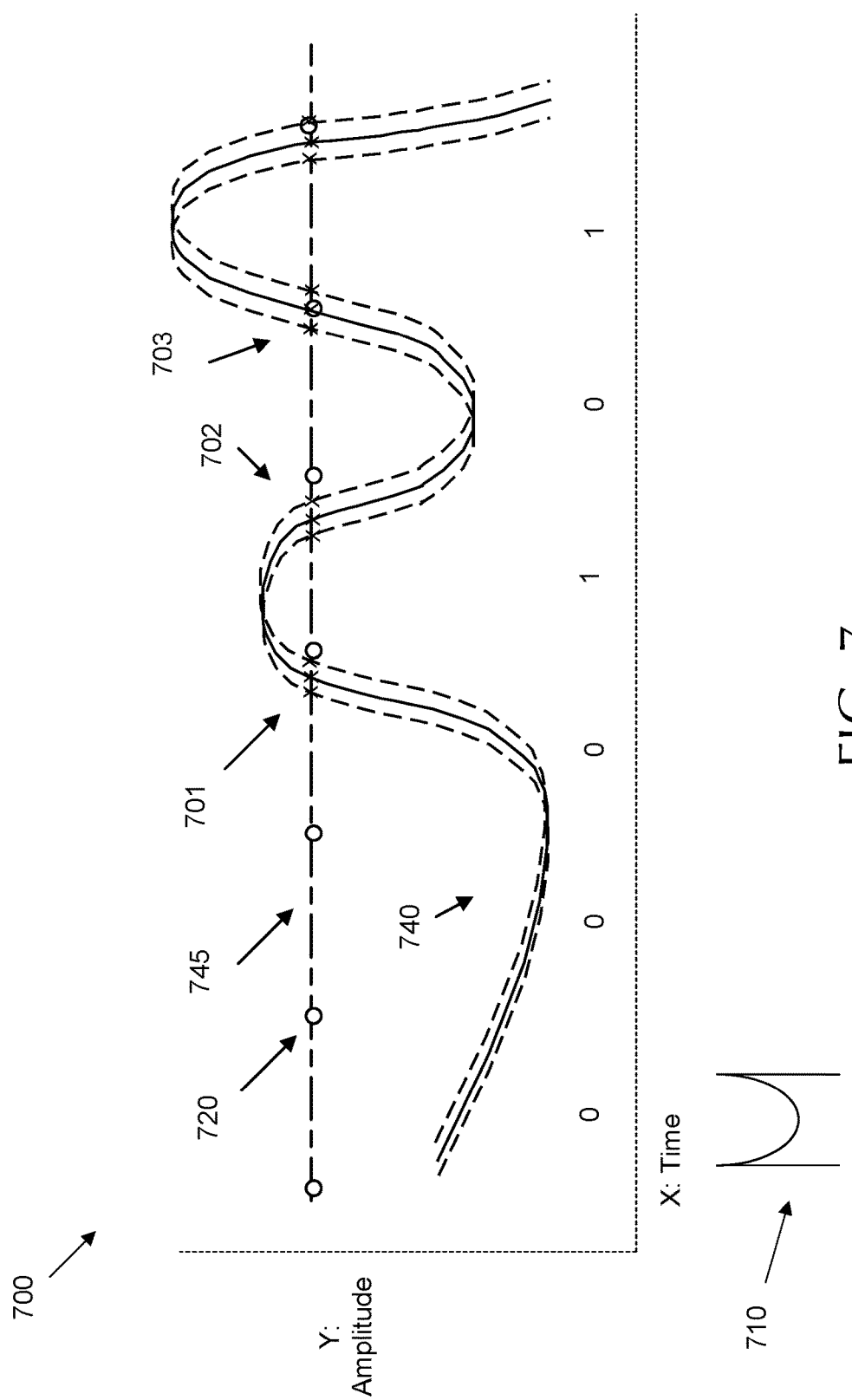
FIG. 7 is a graph of an aspect of ideal waveform after application of an impulse response and jitter.

FIG. 7 is a graph 700 of an aspect of a waveform 740, such as ideal waveform 340, after application of impulse response/ISI and jitter as discussed above with respect to FIGS. 4-6. Waveform 740 is an example of a waveform as received by a receiver, such as Rx 120, after traversing a channel, such as channel 113. Waveform 740 edges 701, 702, and 703, are substantially similar to edges 601, 602, and 603, respectively, after application of ISI. Edges 701, 702, and 703 cross threshold 745 at temporal locations depicted as by x. Due to ISI altering the amplitude of the waveform with respect to the threshold 745, the edges 701, 702, and 703 may not cross the threshold 745 at clock references 720 in some cases. Histogram 710 is substantially similar to histogram 610. As shown, application of ISI/impulse response to waveform 740 does not affect the histogram 710, which depicts signal distribution caused by the uncorrelated jitter. Accordingly, ISI and the uncorrelated jitter should have independent effects on a signal. Further, as waveform 740 is a waveform as received at a receiver, it would be advantageous for a test and measurement system, such as oscilloscope 130, to be configured to display a waveform such as waveform 740 in a substantially similar shape and with a substantially similar histogram 710 to ensure accuracy for testing purposes.

Figure 8:
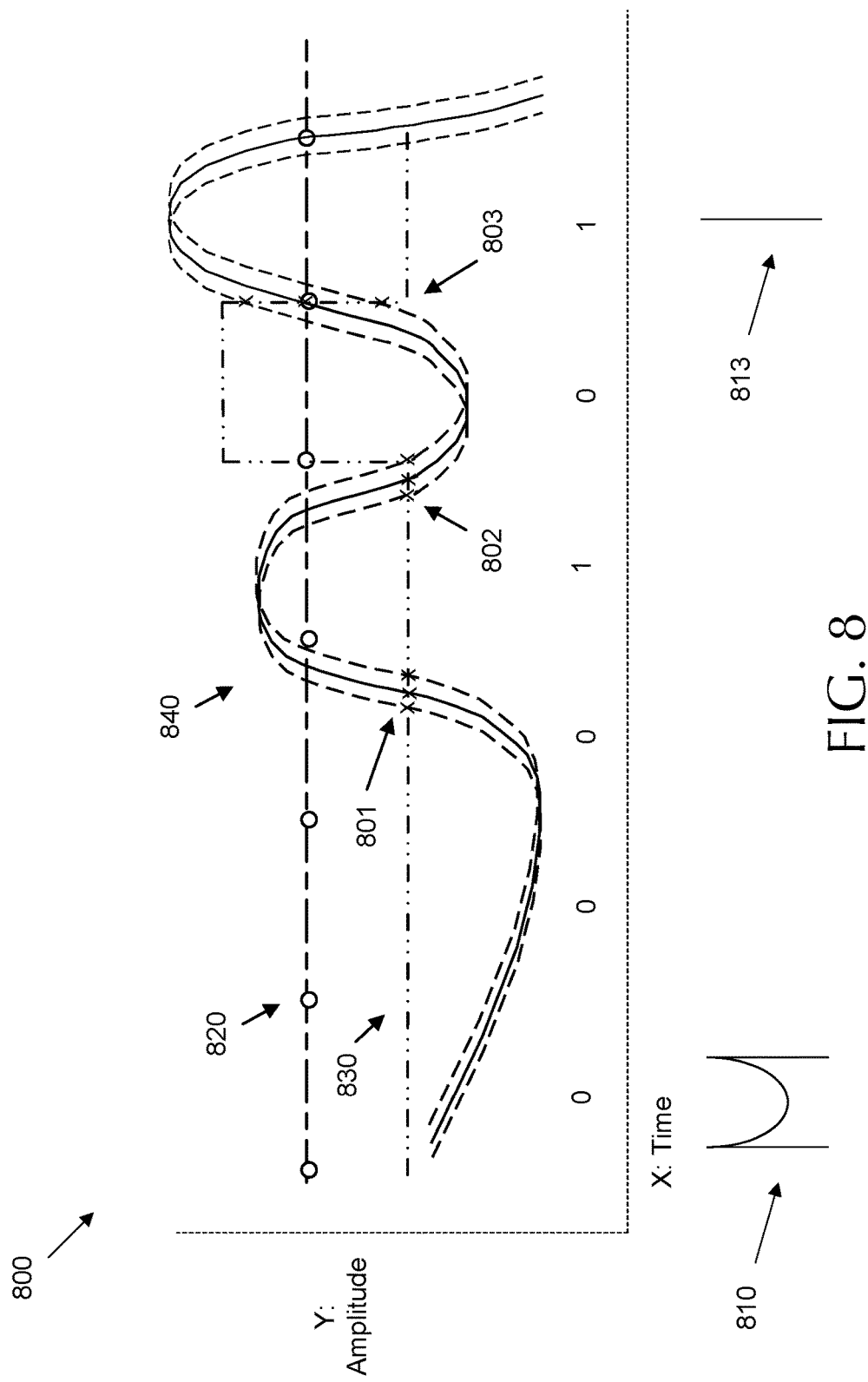
FIG. 8 is a graph of an aspect of DFE slicer movement suppressing jitter in a waveform.

FIG. 8 is a graph 800 of an aspect of DFE slicer 830 movement suppressing jitter in a waveform 840. DFE slicer 830 is a moving threshold implemented by a DFE, such as DFE 131 and/or 200. DFE slicer 830 is depicted in graph 800 as a dashed and dotted line. DFE slicer 830 is a signal threshold used to differentiate between high and low values in a manner similar to threshold 345. However, DFE slicer 830 adjusts over time to address signal changes occurring due to ISI. Specifically, series of low values cause slicer 830 to move lower, while series of high values cause slicer 830 to move higher. Accordingly, slicer 830 considers the context of the signal and not just the amplitude (e.g. in order to account for ISI) when determining whether a symbol is a high value or a low value. DFE slicer 830 adjusts at clock references 820, which are substantially similar to clock references 620 and 720.

Waveform 840 is substantially similar to waveform 740, and contains edges 801, 802, and 803, which are substantially similar to edges 701, 702, and 703, respective. When measured and displayed at a test and measurement system, such as oscilloscope 130, the waveform 840 should match the waveform received at the receiver (e.g. waveform 740). Edges 801 and 802 cross the DFE slicer 830 along the x axis, where such crossings are depicted at temporal locations marked by an x. Hence such crossings occur over time. As such, edges 801 and 802 result in a histogram 810, which shows a distribution that is substantially similar to histogram 710.

However, due to DFE slicer 830 movement, edge 803 crosses the slicer 830 along the y axis. In other words, the slicer 830 transitions across the waveform 840 and associated bounds for the waveform's 840 jitter period at the same instant in time. As a result, histogram 813 for edge 803 is a straight line, depicting edge 803 crossing the slicer 830 at the same temporal location in all cases regardless of jitter. Accordingly, DFE slicer 830 effectively suppresses the jitter associated with edge 803 at a bit transition/clock reference 820. As discussed above, ISI does not affect jitter. However, as shown by edge 803, application of DFE to address ISI can affect jitter. Further, jitter may be measured primarily at bit transitions, causing the DFE slicer 830 to have an increased effect on jitter measurements.

Figure 9:
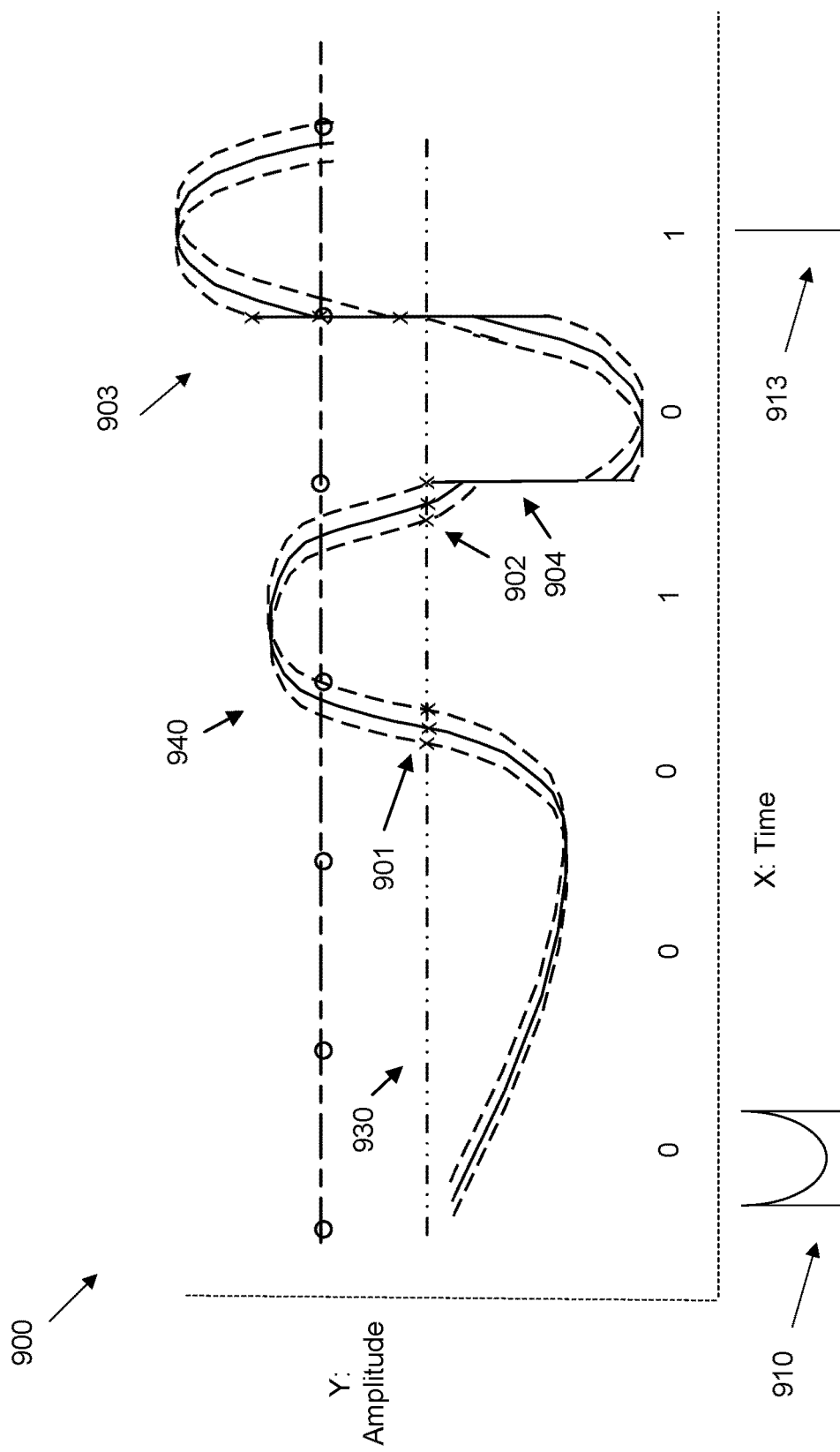
FIG. 9 is a graph of an aspect of waveform modification based on a DFE slicer suppressing jitter in the waveform.

FIG. 9 is a graph of an aspect of waveform 940 modification based on a DFE slicer 930 suppressing jitter in the waveform 940. Waveform 940 is substantially similar to waveform 840. Waveform 940 contains edges 901, 902, and 903, which are substantially similar to edges 801, 802, and 803, respectively. Waveform 940 illustrates an alternate form of DFE. In waveform 940, the DFE slicer 930 is held constant. Instead, the amplitude of waveform 940 is computationally increased or decreased in an inverse manner to DFE slicer 830. In other words, instead of moving DFE slicer 930 up between edge 902 and 903, as in DFE slicer 830, DFE slicer 930 is held constant and waveform 940 is adjusted down.

As shown, edges 901 and 902 maintain histogram 910. However, the implementation of DFE slicer 930 suppresses jitter at both edge 903 and waveform portion 904, resulting in histogram 913, which is similar to histogram 813. Accordingly, a computation DFE employing DFE slicer 940 also suppresses jitter.

Figure 10:
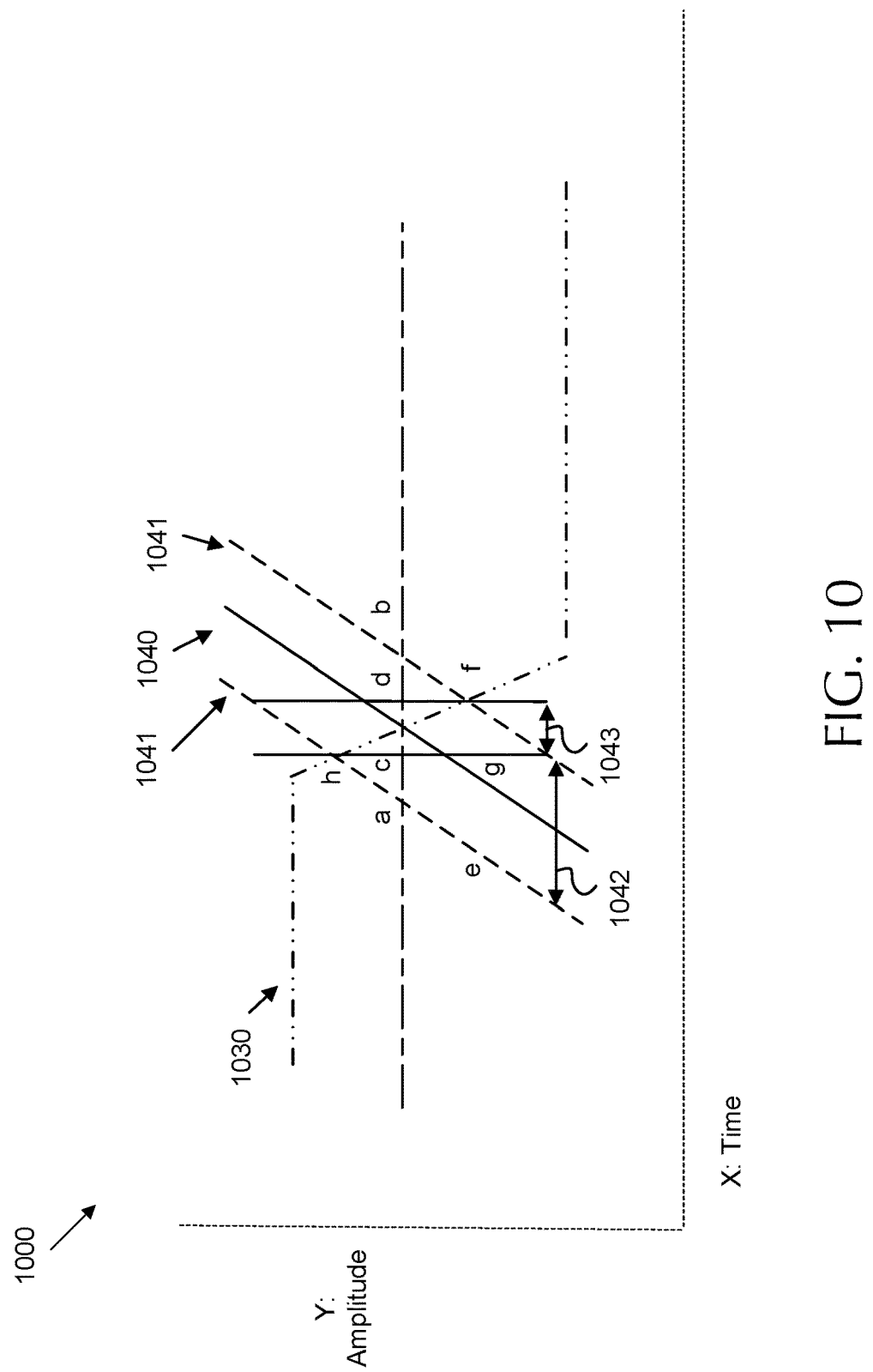
FIG. 10 is a graph of an aspect of a DFE slicer with a finite edge slew rate suppressing jitter in a waveform.

FIG. 10 is a graph 1000 of an aspect of a DFE slicer 1030 with a finite edge slew rate suppressing jitter in a waveform 1040. DFE slicer 830 and amplitude adjustments relative to DFE slicer 930 are depicted as instantaneous. In other words, such DFE slicers immediately transition state at corresponding clock references. Such DFE slicers may be referred to as having an infinite slew rate as the slicer changes state infinitely quickly. An infinite slew rate can be achieved in software based DFE implementations by making discrete DFE slicer changes. Hardware based DFE slicers, such as slicer 1030 may change state in real time. As such, slicer 1030 has a finite slew rate, meaning slicer 1030 switches between states over a finite amount of time. Waveform 1040 is substantially similar to waveform 840, but is shown in greater detail for clarity. Waveform 1040 also includes the periodic jitter boundaries 1041.

As DFE slicer 1030 has a finite slew rate, the waveform 1040 and the periodic jitter boundaries do not all cross the slicer 1030 at the exact same instant. Hence the jitter is not suppressed to zero. However, jitter is still suppressed by a non-zero value (e.g. compressed). For example, waveform 1040 experiences jitter over a time period from peak to peak 1042. However, waveform 1040 and jitter period boundaries 1041 each cross the DFE slicer during a time period from peak to peak 1043. Accordingly, jitter is partially suppressed/compressed from peak to peak 1042 to peak to peak 1043. Mathematically, the jitter conversion ratio (JC) for jitter suppression can be described as follows where a-h are graph points as depicted in FIG. 10, $SR_{slc}$ is the slew rate of the slicer 130, and $SR_{wfm}$ is the slew rate of the waveform 1040:

$$ab = \text{Jitter before DFE} \quad \text{Equation 5}$$

$$cd = \text{Jitter after DFE} \quad \text{Equation 6}$$

$$gf = cd \leq ab = ef \quad \text{Equation 7}$$

$$cd \leq ab \quad \text{Equation 8}$$

$$SR_{wfm} = hg/eg \quad \text{Equation 9}$$

$$SR_{slc} = hg/gf \quad \text{Equation 10}$$

$$JC = \frac{cd}{ab} = \frac{gf}{ef} = \frac{gf}{eg+gf} = \frac{SR_{wfm}}{SR_{wfm}+SR_{slc}} \leq 1 \quad \text{Equation 11}$$

$$JC = 0 \text{ when } SR_{slc} = \infty \quad \text{Equation 12}$$

$$JC = 1 \text{ when } SR_{slc} = 0 \quad \text{Equation 13}$$

FIG. 11*a-h* are graphs 1100 of aspects of DFE slicer patterns 1130 to be applied to bit sequence 1131 based graph sets (e.g. histogram or PDF) to accurately account for the impact of DFE on jitter. DFE slicer patterns 1130 can be employed by a DFE, such as DFE 131. DFE slicer patterns 1130 are selected for each possible three-bit sequence as shown and transition on clock references 1120 as shown. Further, each DFE slicer pattern 1130 can be applied to the third bit in the corresponding set without the slicer traversing the bit waveform along the Y axis. Hence the waveform of the third bit in each set is adjusted for ISI and correctly captures the jitter for the bit. Histograms/PDFs for the third bit in each set are adjusted by DFE slicer in the same way. The histograms/PDFs can then be normalized to generate a complete histogram/PDF and/or an EYE diagram that correctly displays the jitter of the signal at any desired BER.

It should be noted that the DFE slicer patterns 1130 are selected for every three-bit sequence. The number of sets employed is $2^{(N+2)}$ where N is the number of DFE taps. Hence where N is one, a single DFE tap is employed corresponding to eight sets and eight DFE slicer patterns 1130. When progressively higher speed signaling is employed, more DFE taps, longer bit sequences, and a larger number of sets are employed. Specifically, the number of DFE taps increases, resulting in an increase of bit sequence length of N+2, and resulting in $2^{(N+2)}$ sets needed to generate a set for each possible bit sequence. The DFE slicer patterns 1130 may be extended as needed to accurately process the last bit for all possible sets of bit sequences.

Figure 12:
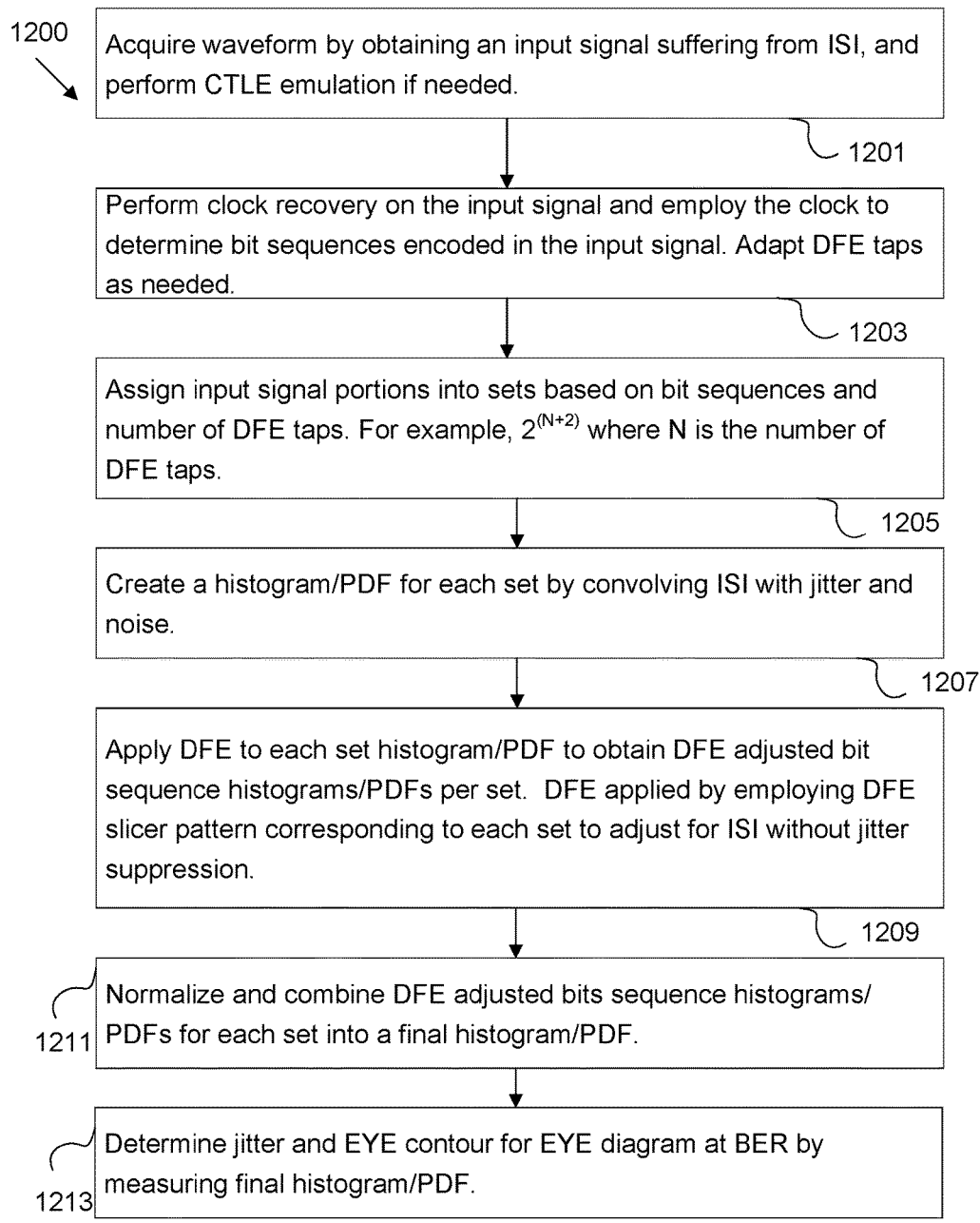
FIG. 12 is a block diagram of an aspect of a method of employing a DFE in a test and measurement system to adjust for ISI and accurately account for the DFE impact on jitter.

FIG. 12 is a block diagram of an aspect of a method 1200 of employing a DFE, such as DFE 131 and/or 200, in a test and measurement system, such as oscilloscope 130 and/or 1300, to adjust for ISI and accurately account for the DFE impact on jitter. At block 1201, a waveform is acquired by obtaining an input signal and/or input signal data associated with an input signal. As noted above the input signal is a high speed serial signal and hence suffers from ISI. CTLE emulation is employed as needed to implement a CTLE such as CTLE 251.

At block 1203, clock recovery is performed on the input signal, for example by employing a clock recovery circuit. Clock recovery results in a clock signal corresponding to the input signal. The recovered clock signal is employed to determine bit sequences encoded in the input signal/data. Further, the number of DFE taps is selected/adapted as needed. For example, the measurement system may receive input from a user. The input may indicate that the waveform is to be tested to comply with a specified standard. The measurement system may then select a number of DFE taps corresponding to the selected standard based on data stored in memory.

At block 1205, portions of the input signal data are assigned into sets based on the corresponding bit sequences and the number of DFE taps as determined at block 1203. Specifically, a number of sets are selected based on the number of DFE taps employed in the DFE. The number of sets is selected as $2^{(N+2)}$ where N is the number of DFE taps. The sets are also selected so that each possible bit sequence N+2 is assigned to a unique set. Each portion of the input signal data can then be assigned to the corresponding set based on the bit sequence encoded in the input signal/data portion.

At block 1207, a histogram or PDF is created for each set that include the un-correlated jitter and noise. A histogram is a graphical representation of the distribution of numerical data, such as the distribution of signal amplitude/data values over all the samples in the corresponding set. A PDF is an alternate mathematical representation expressing the probability that a specified value will occur based on the distribution of previous data set values.

Either a histogram or a PDF can be represented by a waveform database graph, and hence a waveform graph/histogram/PDF is generated for each set. The PDF/histogram for each set may be created by convolving known ISI with uncorrelated jitter (e.g. PJ and RJ) and uncorrelated noise (PN and RN) measured for the set. It should be noted that the creation of the histograms/PDFs for each set is completed prior to application of DFE.

At block 1209, DFE is applied to each set histogram/PDF/graph. The DFE employs DFE slicer patterns corresponding to each set, for example DFE slicer patterns 1130. The DFE slicer patterns are selected to adjust for ISI and accurately capture jitter suppression for the corresponding set and/or a specified bit in the corresponding set. Application of the DFE slicer pattern results in an adjusted waveform graphs/DFE adjusted bit sequences for each set (e.g. in the form of set histograms or set PDFs).

At block 1211, the DFE adjusted graphs/bit sequences for each set (e.g. set histograms or set PDFs) are normalized based on occurrence density and combined into a final histogram/PDF. At block 1213, the jitter and EYE contour for a corresponding EYE diagram at the desired BER is determined based on the final histogram/PDF. By separating the input signal data into sets, generating the histograms/PDF for the sets with accurately capturing jitter suppression by DFE, and combining the histograms/PDFs, the resulting EYE diagram accurately depicts the input signal on the oscilloscope display, for example as received by a receiver after traversing a channel, such as receiver 120 and channel 113, respectively.

Figure 13:
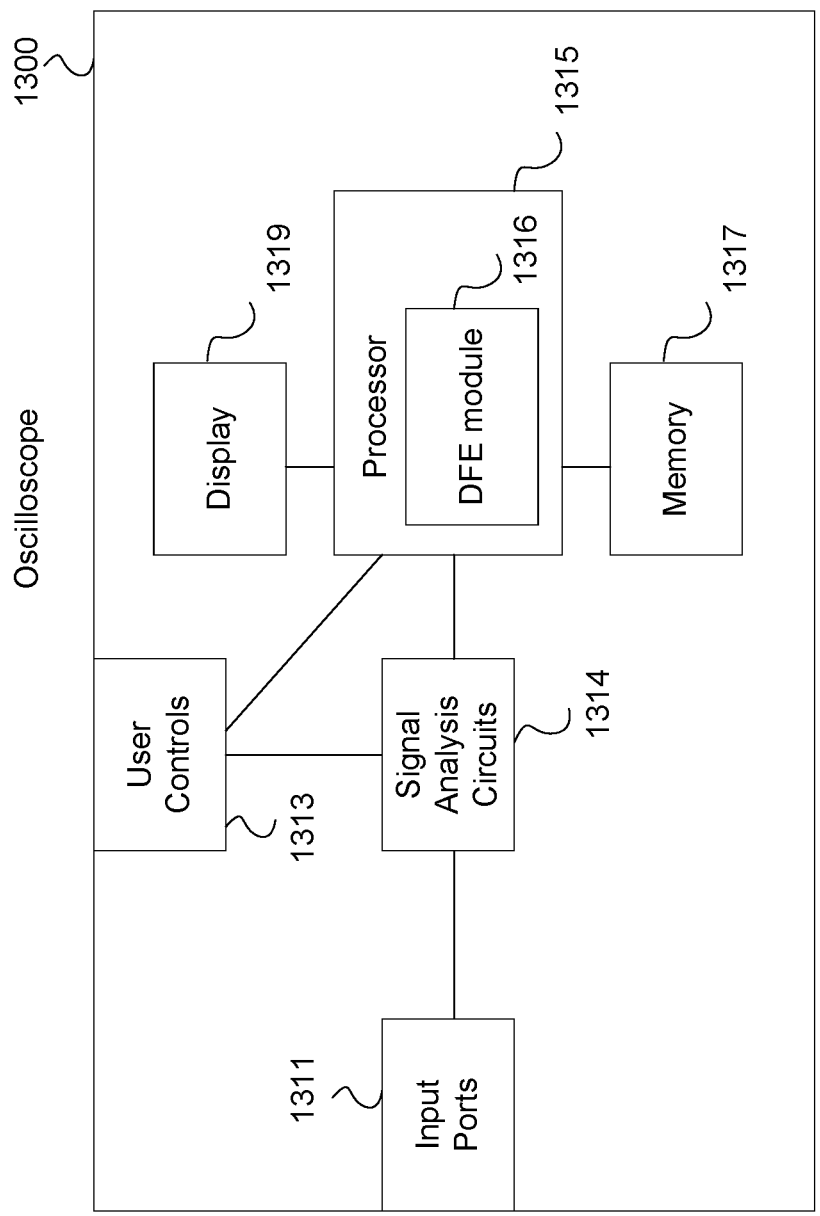
FIG. 13 is an aspect of an oscilloscope configured to act as a test and measurement system for application of DFE.

FIG. 13 is an aspect of an oscilloscope 1300 configured to act as a test and measurement system, such as oscilloscope 130 for application of DFE, such as DFE 131. Oscilloscope 100 may be employed to implement and/or operate in conjunction with oscilloscope 130, channel 113 Tx 110, and/or Rx 120. Oscilloscope 100 may also be configured to implement method 1200, for example by employing DFE slicer patterns 1130, and/or any other method disclosed herein. Oscilloscope 100 comprises signal input ports 1311 which may be any electrical and/or optical ports, receivers, etc. configured to accept an input signal for testing purposes, such as a signal suffering from ISI. Input ports 1311 are coupled to signal analysis circuits 1314, which may comprise amplifiers, samplers, phase reference circuits, clock recovery circuits, and/or other components for signal sampling and/or signal conditioning. Signal analysis circuits 1314 receive input signals from the input ports 511, perform sampling and other signal analysis on the input signals, and perform clock signal recovery. Signal analysis circuits 514 may be implemented as one or more application specific integrated circuits (ASICs), digital signal processor (DSPs), or other processing circuitry. Signal analysis circuits 1314 may also be configured to store input signal data to memory for further processing. Signal analysis circuits 1314 are coupled to processor 1315, which may be implemented as a general purpose processor. Processor 1315 is configured to execute instructions from memory 1317 and perform any methods and/or associated steps indicated by the instructions. Memory 1317 may be implemented as processor cache, random access memory (RAM), read only memory (ROM), solid state memory, hard disk drive(s), or any other memory type. Memory 1317 acts as a non-transitory medium for storing data, computer program products, and other instructions, and providing such data/products/instruction to the processor 1315 for computation as needed.

Processor 1315 may comprise a DFE module 1316. The DFE module 1316 is a processing circuit and/or set of instructions configured to determine bit sequences represented by input signal data, sort the input signal data into sets based on the bit sequences, generate histograms/PDFs for each set, apply a DFE slicer to each graph, and normalize and combine the resulting data into a final histogram/PDF. DFE module 1316 is further configured to perform method 1200 and any other method disclosed herein. In some embodiments, the DFE module 516 may also be implemented, in whole or in part, in the memory 1317, processor 1315, signal analysis circuits 1314, user controls 1313, and/or display 1319.

User controls 1313 are coupled to the processor 1315 and signal analysis circuits 514. User controls 1313 may comprise strobe inputs, gain controls, triggers, display adjustments, power controls, or any other controls employable by a user to display or alter a display of an input signal on display 1319. Display 1319 may be a digital screen or a cathode ray tube based display. Display 1319 comprises a plurality of graticules for displaying corresponding input signals, for example as eye diagrams. Accordingly, oscilloscope 1300 may receive input signals suffering from ISI via signal input ports 1311, sample/analyze the input signals, sort the data into sets based on bit sequence, apply a DFE slicer pattern per set to accurately capture jitter suppression, and generate a corresponding EYE diagram that correctly represents the input signals for display on the display 1319 graticule based on user input received via user controls 1313.

Aspects of the invention may operate on a particularly created hardware, on firmware, digital signal processors, or on a specially programmed general purpose computer including a processor operating according to programmed instructions. The terms controller or processor as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various aspects. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the invention have been illustrated and described for purposes of illustration, it will be understood that various modifications may be made without departing from the spirit and scope of the invention. Accordingly, the invention should not be limited except as by the appended claims.

I claim:

1. A test and measurement system comprising:
    an input port structured to receive an input signal via a channel suffering from inter-symbol interference (ISI); and
    a processor configured to:
        determine bit sequences encoded in the input signal;
        assign portions of the input signal into sets based on the corresponding bit sequences;
        apply a Decision Feedback Equalizer (DFE) to graphs for each set by employing a DFE slicer pattern corresponding to each set in order to obtain DFE adjusted graphs that accurately capture jitter suppression; and
        normalize and combine the DFE adjusted graphs;
    in which the processor is further configured to generate a histogram or a probability density function (PDF) for each set prior to applying the DFE, such that the DFE adjusted graphs include set histograms or PDFs for each set, and in which each set histogram or PDF is generated by convolving an averaged ISI pattern with uncorrelated jitter and uncorrelated noise measured for the set before the application of DFE.

2. The test and measurement system of claim 1, in which the processor is further configured to select a number of the sets based on a number of DFE taps employed in the DFE.

3. The test and measurement system of claim 2, in which the number of sets is selected as $2^{(N+2)}$ where N is the number of DFE taps employed in the DFE.

4. The test and measurement system of claim 1, in which normalizing and combining the DFE adjusted bit sequences includes:
    normalizing the set histograms or PDFs based on occurrence density; and
    combining the normalized set histograms or PDFs into a final histogram or PDF.

5. The test and measurement system of claim 4, in which the processor is further configured to determine an eye contour of an eye diagram based on the final histogram or PDF.

6. A method of employing a Decision Feedback Equalizer (DFE) in a test and measurement system, the method comprising:
    obtaining input signal data associated with an input signal suffering from inter-symbol interference (ISI);
    determining bit sequences encoded in the input signal data;
    assigning portions of the input signal data into sets based on the corresponding bit sequences;
    generating a waveform database graph for each set, prior to applying the DFE, by convolving an averaged ISI pattern with uncorrelated jitter and uncorrelated noise measured for the set before the application of DFE;
    applying the DFE to graphs for each set by employing a DFE slicer pattern corresponding to each set in order to obtain a DFE adjusted waveform database graph that accurately captures jitter suppression;
    normalizing the DFE adjusted waveform database graphs; and
    combining the normalized DFE adjusted waveform database graphs into a final waveform graph.

7. The method of claim 6, further comprising selecting a number of the sets based on a number of DFE taps employed in the DFE.

8. The method of claim 6, further comprising determining an eye contour of an eye diagram based on the final waveform database graph.

* * * * *